(12) United States Patent
Lee et al.

(10) Patent No.: US 12,456,673 B2
(45) Date of Patent: Oct. 28, 2025

(54) FLIP CHIP PACKAGE AND SUBSTRATE THEREOF

(71) Applicant: CHIPBOND TECHNOLOGY CORPORATION, Hsinchu (TW)

(72) Inventors: Chun-Te Lee, Hsinchu County (TW); Chih-Ming Peng, Taichung (TW); Pi-Yu Peng, Hsinchu County (TW); Hui-Yu Huang, Hsinchu (TW); Yin-Chen Lin, Miaoli County (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 399 days.

(21) Appl. No.: 18/214,572

(22) Filed: Jun. 27, 2023

(65) Prior Publication Data

US 2024/0014118 A1    Jan. 11, 2024

(30) Foreign Application Priority Data

Jul. 8, 2022    (TW) .................................. 111125640

(51) Int. Cl.
*H01L 23/498* (2006.01)
*H01L 23/00* (2006.01)

(52) U.S. Cl.
CPC ........ *H01L 23/49838* (2013.01); *H01L 24/13* (2013.01); *H01L 24/14* (2013.01);
(Continued)

(58) Field of Classification Search
CPC ... H01L 23/49838; H01L 24/13; H01L 24/14; H01L 24/16; H01L 2224/13013;
(Continued)

(56) References Cited

U.S. PATENT DOCUMENTS 6,661,084 B1 *    12/2003    Peterson ............... H01L 25/105
                                                                257/737
2004/0046248 A1 *    3/2004    Waelti ................... B81B 7/0048
                                                            257/713
(Continued)

FOREIGN PATENT DOCUMENTS

JP    2000-235191 A    8/2000
JP    2008-141022 A    6/2008
(Continued)

OTHER PUBLICATIONS

Taiwanese Office Action mailed Jan. 16, 2023 for Taiwanese Patent Application No. 111125640, 3 pages.
(Continued)

*Primary Examiner* — Douglas W Owens
(74) *Attorney, Agent, or Firm* — Demian K. Jackson; Jackson IPG PLLC

(57) ABSTRACT

In a flip chip package, lines, an identification line and a dummy line are provided on a first surface of a light-transmissive carrier, and a supportive layer is disposed on a second surface of the light-transmissive carrier. Bumps and an identification bump of a chip are bonded to the lines and the identification line, respectively. Shadows of the dummy line, the identification line and the identification bump which are projected on the second surface are visible from an opening of the supportive layer. The shadows can be inspected through the opening so as to know whether the bumps are bonded to the lines correctly.

17 Claims, 3 Drawing Sheets

(52) U.S. Cl.
CPC .... *H01L 24/16* (2013.01); *H01L 2224/13013* (2013.01); *H01L 2224/14163* (2013.01); *H01L 2224/16227* (2013.01)

(58) Field of Classification Search
CPC . H01L 2224/14163; H01L 2224/16227; H01L 2224/1412; H01L 23/528; H01L 2224/81; H01L 22/12; H01L 23/12; H01L 23/492; H01L 24/10; H01L 24/17; H01L 23/13; H01L 23/49811; H01L 23/544; H01L 23/562; H01L 24/81; H01L 2223/54426; H01L 2224/16221; H01L 2224/1751; H01L 2224/8113

See application file for complete search history.

(56) References Cited

U.S. PATENT DOCUMENTS

| | | |
|---|---|---|
| 2011/0215466 A1 | 9/2011 | Hsu et al. |
| 2011/0248399 A1 | 10/2011 | Pendse |
| 2017/0287939 A1 | 10/2017 | Okamae et al. |
| 2019/0179091 A1 | 6/2019 | Kinghorn et al. |
| 2020/0286817 A1 | 9/2020 | Choi et al. |
| 2023/0380053 A1* | 11/2023 | Lee ..................... H05K 1/0269 |

FOREIGN PATENT DOCUMENTS

| | | |
|---|---|---|
| JP | 2017-181984 A | 10/2017 |
| JP | 2018-032584 A | 3/2018 |
| KR | 10-2020-0031733 A | 3/2020 |
| KR | 10-2021-0109445 A | 9/2021 |
| KR | 20-2023-0002259 U | 11/2023 |

OTHER PUBLICATIONS

Japanese notice of allowance mailed Aug. 9, 2024 for Japanese patent application No. 2023-106199, 3 pages.
Korean notice of allowance mailed Dec. 18, 2024 for Korean patent application No. 10-2023-0083593, 2 pages.

* cited by examiner

FLIP CHIP PACKAGE AND SUBSTRATE THEREOF

FIELD OF THE INVENTION

This invention relates to a flip chip package, and more particularly to a flip chip package which makes available to inspect bonding between bumps and circuit lines.

BACKGROUND OF THE INVENTION

In a conventional flip chip package, a patterned metal layer is provided on a substrate, and bumps of a chip are bonded to circuit lines of the patterned metal layer. Owing to the bumps and the circuit lines are located between and shielded by the substrate and the chip after bonding, it is not easy to inspect bonding between the bumps and the circuit lines from outside of the conventional flip chip package.

SUMMARY

One object of the present invention is to provide a flip chip package, a supportive layer disposed on a surface of a light-transmissive carrier has an opening that is able to show shadows of a dummy line, an identification line and an identification bump which are projected on the surface of the light-transmissive carrier, so it is available to know whether bumps of a chip are bonded to a patterned metal layer correctly.

A flip chip package of the present invention includes a chip and a substrate. The chip includes first bumps, second bumps and at least one identification bump. The substrate includes a light-transmissive carrier, a patterned metal layer and a supportive layer. The light-transmissive carrier has a first surface and a second surface which are opposite. A chip-mounting area and a circuit area are defined on the first surface, and a supportive area opposite to the chip-mounting area is defined on the second surface. The patterned metal layer is arranged on the chip-mounting area and the circuit area and includes first lines, second lines, at least one identification line and a first dummy line. A first lead of each of the first lines, a second lead of each of the second lines, an identification lead of the identification line and the first dummy line are located on the chip-mounting area. The second lead is adjacent to the first lead. The identification lead is located on one side of the first dummy line and projects a lead shadow on the second surface. The first dummy line projects a first measurement shadow on the second surface. The first bumps are bonded to the first leads of the first lines, the second bumps are bonded to the second leads of the second lines, the identification bump is bonded to the identification lead of the identification line. After bonding, the first lead, the second lead, the identification lead, the first bumps, the second bumps and the identification bump are shielded by the chip. The identification bump projects a second measurement shadow on the second surface, and a width of the lead shadow is less than a width of the second measurement shadow in a direction parallel to a first imaginary line. The supportive layer is disposed on the supportive area and covers shadows of the first lead, the second lead, the first bumps and the second bumps which are projected on the second surface. The first and second measurement shadows are visible from an opening of the supportive layer, and there is a first gap between the first and second measurement shadows in the direction parallel to the first imaginary line.

A substrate of a flip chip package of the present invention includes a light-transmissive carrier, a patterned metal layer and a supportive layer. The light-transmissive carrier has a first surface and a second surface which are opposite. A chip-mounting area and a circuit area are defined on the first surface, a supportive area opposite to the chip-mounting area is defined on the second surface. The patterned metal layer is disposed on the chip-mounting area and the circuit area and includes first lines, second lines, at least one identification line and a first dummy line. A first lead of each of the first lines, a second lead of each of the second lines, an identification lead of the identification line and the first dummy line are arranged on the chip-mounting area. The second lead is adjacent to the first lead. The identification lead is located on one side of the first dummy line and projects a lead shadow on the second surface. The first dummy line projects a first measurement shadow on the second surface. The supportive layer is disposed on the supportive area of the second surface and configured to shield shadows of the first and second leads which are projected on the second surface. The lead shadow and the first measurement shadow are visible from an opening of the supportive layer.

In the present invention, the shadows of the identification line, the dummy line and the identification bump which is bonded to the identification line are visible from the opening of the supportive layer. As a result, it is available to inspect bonding between the identification bump and the identification line, and further to know whether the first and second bumps are bonded to the first and second leads incorrectly or obliquely. According to the first gap between the first and second measurement shadows, bonding situation of the first bumps and the first leads which are shielded by the chip and the supportive layer can be known, and also, bonding situation of the second bumps and the second leads which are shielded by the chip and the supportive layer can be known.

DETAILED DESCRIPTION OF THE INVENTION

With reference to FIGS. 1 to 4, a flip chip package 100 in accordance with one embodiment of the present invention includes a chip 110 and a substrate 120, and the chip 110 is flip bonded to the substrate 120.

Figure 1:
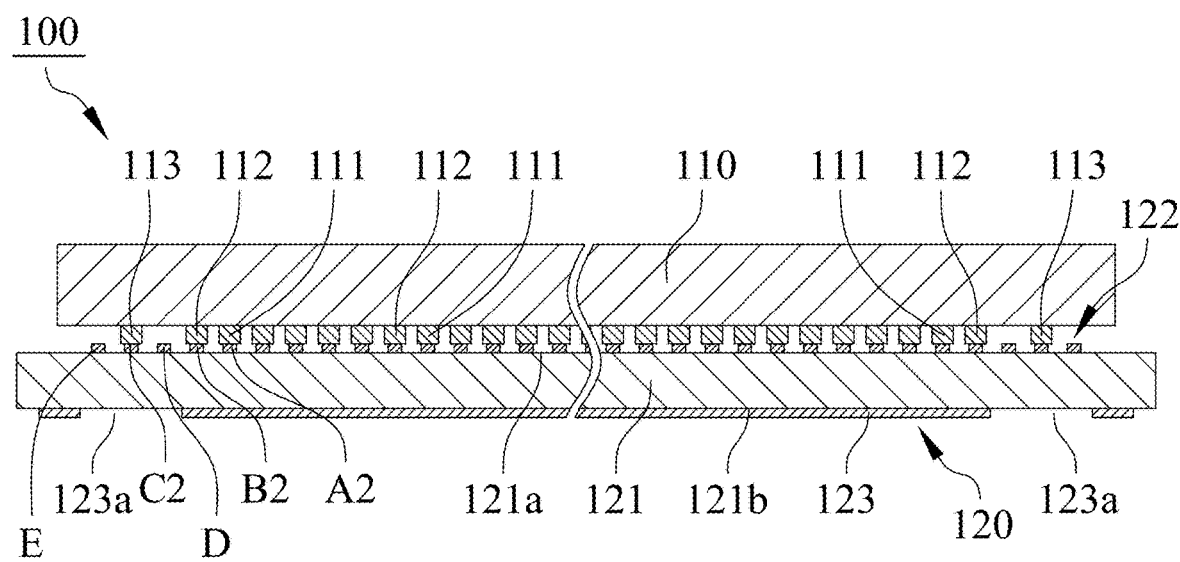
FIG. 1 is a cross-section view diagram illustrating a flip chip package in accordance with one embodiment of the present invention.
Figure 2:
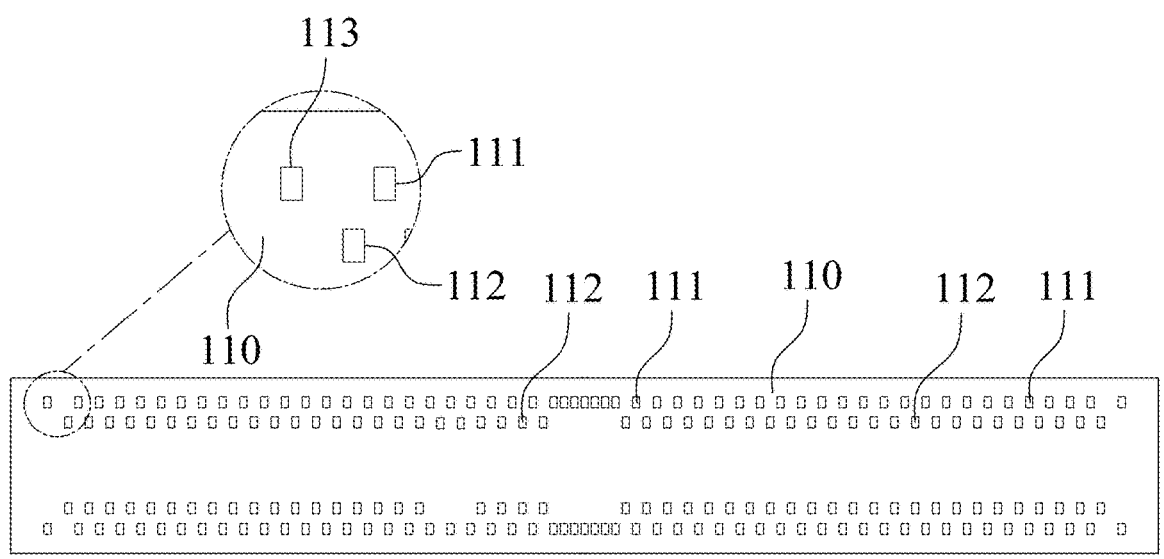
FIG. 2 is a bottom view diagram illustrating a chip of a flip chip package in accordance with one embodiment of the present invention.

As shown in FIGS. 1 and 2, the chip 110 includes a plurality of first bumps 111, a plurality of second bumps 112 and at least one identification bump 113. In this embodiment, the identification bump 113 is, but not limit to, located on a corner of the active surface of the chip 110, and the identification bump 113 can be a functional bump or a dummy bump.

Figure 3:
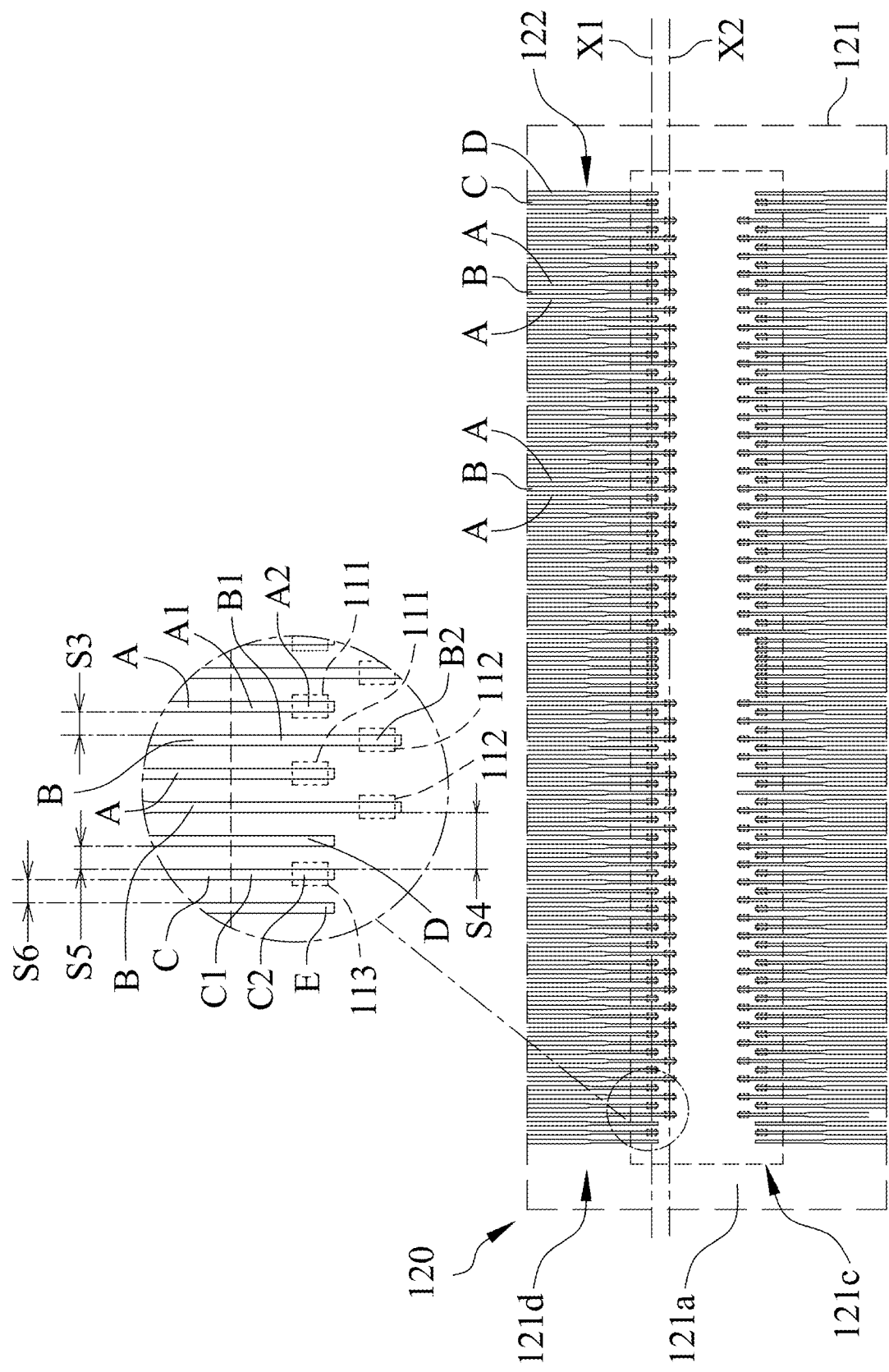
FIG. 3 is a perspective bottom view diagram illustrating a flip chip package in accordance with one embodiment of the present invention.
Figure 4:
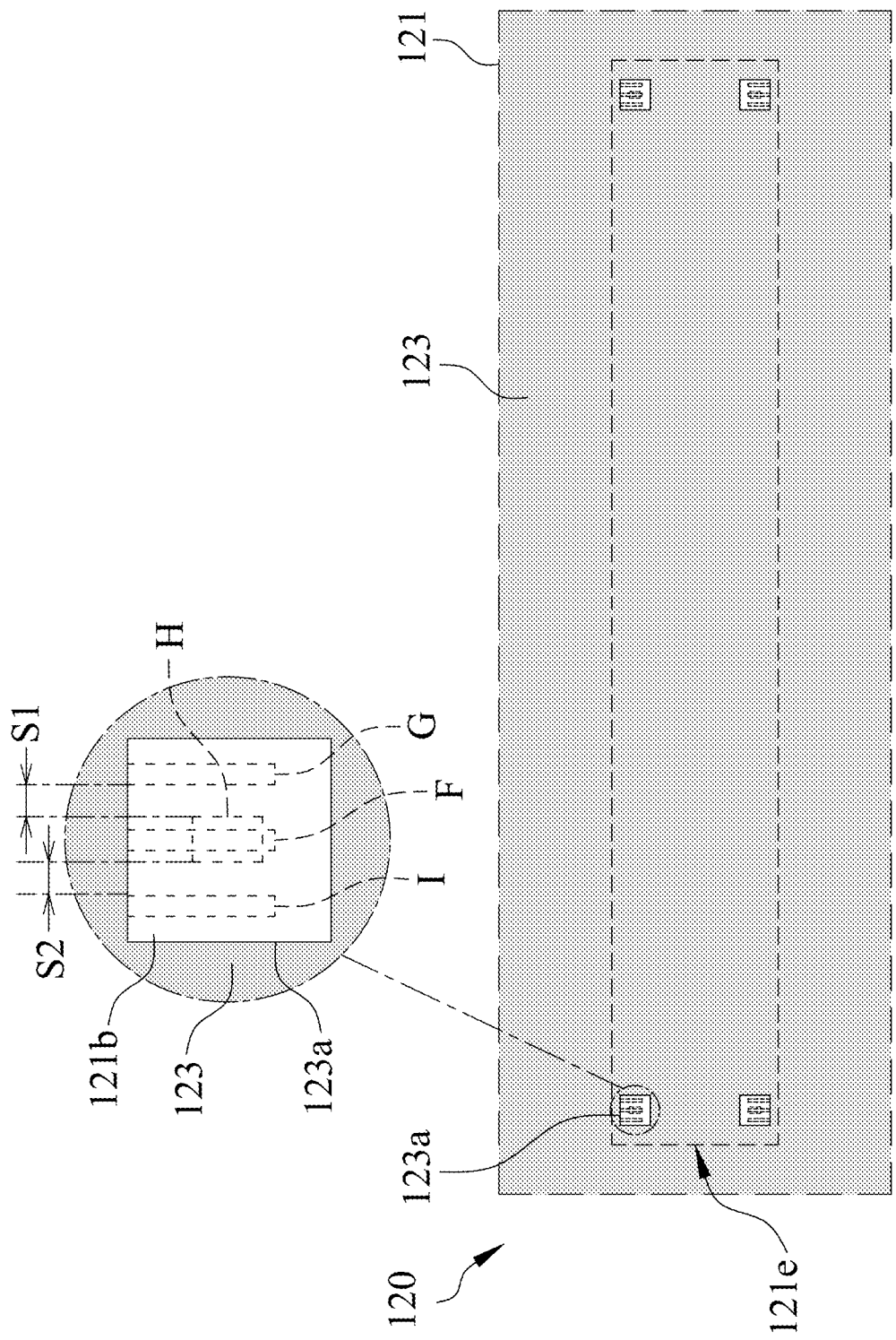
FIG. 4 is a bottom view diagram illustrating a flip chip package in accordance with one embodiment of the present invention.

With reference to FIGS. 1, 3 and 4, the substrate 120 includes a light-transmissive carrier 121, a patterned metal layer 122 and a supportive layer 123. A chip-mounting area 121c and a circuit area 121d are defined on a first surface 121a of the light-transmissive carrier 121, and a supportive area 121e is defined on a second surface 121b of the light-transmissive carrier 121. The second surface 121b is opposite to the first surface 121a, and the supportive area 121e defined on the second surface 121b is opposite to the chip-mounting area 121c defined on the first surface 121a.

With reference to FIGS. 1 and 3, the patterned metal layer 122 is located on the chip-mounting area 121c and the circuit area 121d of the first surface 121a of the light-transmissive carrier 121. The patterned metal layer 122 includes a plurality of first lines A, a plurality of second lines B, at least one identification line C and a first dummy line D. A first lead A1 of each of the first lines A, a second lead B1 of each of the second lines B, an identification lead C1 of the identification line C and the first dummy line D are located on the chip-mounting area 121c. The second lead B1 of each of the second lines B is adjacent to the first lead A1 of each of the first lines A. In this embodiment, the second lead B1 is located between two first leads A1, and in other embodiment, the first lead A1 is located between two second leads B1. The identification lead C1 of the identification line C is located on one side of the first dummy line D. Preferably, the patterned metal layer 122 further includes a second dummy line E located on the chip-mounting area 121c, and the identification lead C1 of the identification line C is located between the first dummy line D and the second dummy line E in this embodiment.

As shown in FIG. 3, a third gap S3 exists between the first lead A1 and the second lead B1 which are adjacent, a fourth gap S4 exists between the identification lead C1 and the adjacent first lead A1 or exists between the identification lead C1 and the adjacent second lead B1, and the fourth gap S4 is greater than the third gap S3. With reference to FIG. 3, in this embodiment, there is a fifth gap S5 between the identification lead C1 and the first dummy line D, and there is a sixth gap S6 between the identification lead C1 and the second dummy line E, the fifth gap S5 and the sixth gap S6 are equal to the third gap S3. In another embodiment, the fifth gap S5 and the sixth gap S6 are not equal to the third gap S3, they may be less than or greater than the third gap S3.

With reference to FIGS. 3 and 4, the identification lead C1 on the first surface 121a of the light-transmissive carrier 121 projects a lead shadow F on the second surface 121b of the light-transmissive carrier 121, the first dummy lead D on the first surface 121a of the light-transmissive carrier 121 projects a first measurement shadow G on the second surface 121b of the light-transmissive carrier 121, and the second dummy lead E on the first surface 121a of the light-transmissive carrier 121 projects a third measurement shadow I on the second surface 121b of the light-transmissive carrier 121.

With reference to FIGS. 1, 3 and 4, the first bumps 111 are bonded to the first leads A1, the second bumps 112 are bonded to the second leads B1, and the identification bump 113 is bonded to the identification lead C1. In this embodiment, each of the first bumps 111 is bonded to a first bonding portion A2 of one of the first leads A1, each of the second bumps 112 is bonded to a second bonding portion B2 of one of the second leads B1, and the identification bump 113 is bonded to a third bonding portion C2 of the identification lead C1. A first imaginary line X1 passes through the first bonding portion A2 of each of the first leads A1 and the third bonding portion C2 of the identification lead C1, and a second imaginary line X2 parallel to the first imaginary line X1 passes through the second bonding portion B2 of each of the second leads B1.

With reference to FIGS. 3 and 4, the identification bump 113 bonded to the identification lead C1 projects a second measurement shadow H on the second surface 121b of the light-transmissive carrier 121, and a width of the lead shadow F is less than a width of the second measurement shadow H in a direction parallel to the first imaginary line X1.

With reference to FIGS. 1 and 4, the supportive layer 123 is at least disposed on the supportive area 121e which is defined on the second surface 121b of the light-transmissive carrier 121. The supportive layer 123 can be a patterned functional metal layer and electrically connected to the patterned metal layer 122 on the first surface 121a through a connection via (not shown) in the light-transmissive carrier 121, and the supportive layer 123 can increase stress resistance and warpage resistance of the light-transmissive carrier 121.

With reference to FIGS. 1, 3 and 4, after bonding the chip 110 on the patterned metal layer 122 through the first bumps 111, the second bumps 112 and the identification bump 113, the first leads A1, the second leads B1, the identification lead C1, the first bumps 111, the second bumps 112 and the identification bump 113 are shielded by the chip 110. And shadows of the first leads A1, the second leads B1, the first bumps 111 and the second bumps 112 which are projected on the second surface 121b of the light-transmissive carrier 121 are shielded by the supportive layer 123.

With reference to FIGS. 1 and 4, the lead shadow F of the identification lead C1, the first measurement shadow G of the first dummy lead D and the second measurement shadow H of the identification bump 113 are visible from an opening 123a of the supportive layer 123. And in this embodiment, the third measurement shadow I of the second dummy lead E is also visible from the opening 123a. Because of the opening 123a of the supportive layer 123, it is able to inspect whether the lead shadow F of the identification lead C1 and the second measurement shadow H of the identification bump 113 are misaligned, and further to know whether the first bumps 111 and the second bumps 112 are bonded to the first leads A1 and the second leads B1 incorrectly or obliquely.

With reference to FIGS. 3 and 4, people can measure a first gap S1 between the first measurement shadow G and the second measurement shadow H in the direction parallel to the first imaginary line X1, and also can measure a second gap S2 between the third measurement shadow I and the second measurement shadow H in the direction parallel to the first imaginary line X1. And preferably, according to the values of the first gap S1 and the second gap S2, people can estimate whether the displacement or skew amount of the first bumps 111 bonded to the first leads A1 and the second bumps 112 bonded to the second leads B1 are up to standard.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:
1. A flip chip package comprising:
  a chip including a plurality of first bumps, a plurality of second bumps and at least one identification bump; and a substrate including:
  a light-transmissive carrier including a first surface and a second surface, a chip-mounting area and a circuit area are defined on the first surface, a supportive area opposite to the chip-mounting area is defined on the second surface;
  a patterned metal layer disposed on the chip-mounting area and the circuit area and including a plurality of first lines, a plurality of second lines, at least one identification line and a first dummy line, a first lead of each of the plurality of first lines, a second lead of each of the plurality of second lines, an identification lead of the at least one identification line and the first dummy line are located on the chip-mounting area, the second lead is adjacent to the first lead, the identification lead is located on one side of the first dummy line and projects a lead shadow on the second surface, the first dummy line projects a first measurement shadow on the second surface, each of the plurality of first bumps is bonded to the first lead of one of the plurality of first lines, each of the plurality of second bumps is bonded to the second lead of one of the plurality of second lines, the at least one identification bump is bonded to the identification lead, wherein the first lead, the second lead, the identification lead, the plurality of first bumps, the plurality of second bumps and the at least one identification bump are configured to be covered by the chip, wherein the identification bump projects a second measurement shadow on the second surface, and a width of the lead shadow is less than a width of the second measurement shadow in a direction parallel to a first imaginary line; and
  a supportive layer disposed on the supportive area and configured to cover shadows of the first lead, the second lead, the plurality of first bumps and the plurality of second bumps which are projected on the second surface, wherein the first and second measurement shadows are visible from an opening of the supportive layer, and there is a first gap between the first and second measurement shadows in the direction parallel to the first imaginary line.

2. The flip chip package in accordance with claim 1, wherein the patterned metal layer further includes a second dummy line located on the chip-mounting area, the identification lead is located between the first and second dummy lines, the second dummy line projects a third measurement shadow on the second surface, the third measurement shadow is visible from the opening of the supportive layer, and there is a second gap between the second and third measurement shadows in the direction parallel to the first imaginary line.

3. The flip chip package in accordance with claim 2, wherein each of the plurality of first bumps is bonded to a first bonding portion of the first lead of one of the plurality of first lines, each of the plurality of second bumps is bonded to a second bonding portion of the second lead of one of the plurality of second lines, the at least one identification bump is bonded to a third bonding portion of the identification lead, the first and third bonding portions are configured to be passed through by the first imaginary line, the second bonding portion is configured to be passed through by a second imaginary line which is parallel to the first imaginary line.

4. The flip chip package in accordance with claim 1, wherein there is a third gap between the first and second leads which are adjacent, and there is a fourth gap between the identification lead and the adjacent first lead or between the identification lead and the adjacent second lead, the fourth gap is greater than the third gap.

5. The flip chip package in accordance with claim 4, wherein there is a fifth gap between the identification lead and the first dummy line, and the fifth gap is equal to the third gap.

6. The flip chip package in accordance with claim 2, wherein there is a third gap between the first and second leads which are adjacent, and there is a fourth gap between the identification lead and the adjacent first lead or between the identification lead and the adjacent second lead, the fourth gap is greater than the third gap.

7. The flip chip package in accordance with claim 6, wherein there is a fifth gap between the identification lead and the first dummy line, and the fifth gap is equal to the third gap.

8. The flip chip package in accordance with claim 3, wherein there is a third gap between the first and second leads which are adjacent, and there is a fourth gap between the identification lead and the adjacent first lead or between the identification lead and the adjacent second lead, the fourth gap is greater than the third gap.

9. The flip chip package in accordance with claim 8, wherein there is a fifth gap between the identification lead and the first dummy line, and the fifth gap is equal to the third gap.

10. The flip chip package in accordance with claim 2, wherein there is a third gap between the first and second leads which are adjacent, and there is a fourth gap between the identification lead and the adjacent first lead or between the identification lead and the adjacent second lead, the fourth gap is greater than the third gap, there is a fifth gap between the identification lead and the first dummy line, and there is a sixth gap between the identification lead and the second dummy line, the fifth and sixth gaps are equal to the third gap.

11. A substrate comprising:
  a light-transmissive carrier having a first surface and a second surface, a chip-mounting area and a circuit area are defined on the first surface, a supportive area opposite to the chip-mounting area is defined on the second surface;
  a patterned metal layer disposed on the chip-mounting area and the circuit area and including a plurality of first lines, a plurality of second lines, at least one identification line and a first dummy line, a first lead of each of the plurality of first lines, a second lead of each of the plurality of second lines, an identification lead of the at least one identification line and the first dummy line are located on the chip-mounting area, the second lead is adjacent to the first lead, the identification lead is located on one side of the first dummy line and projects a lead shadow on the second surface, the first dummy line projects a first measurement shadow on the second surface; and
  a supportive layer disposed on the supportive area and configured to cover shadows of the first and second leads which are projected on the second surface, wherein the lead shadow and the first measurement shadow are visible from an opening of the supportive layer.

12. The substrate in accordance with claim 11, wherein the patterned metal layer further includes a second dummy line located on the chip-mounting area, the identification lead is located between the first and second dummy lines, the second dummy line projects a third measurement shadow on the second surface, and the third measurement shadow is visible from the opening of the supportive layer.

13. The substrate in accordance with claim 11, wherein there is a third gap between the first and second leads which are adjacent, and there is a fourth gap between the identification lead and the adjacent first lead or between the identification lead and the adjacent second lead, the fourth gap is greater than the third gap.

14. The substrate in accordance with claim 13, wherein there is a fifth gap between the identification lead and the first dummy line, and the fifth gap is equal to the third gap.

15. The substrate in accordance with claim 12, wherein there is a third gap between the first and second leads which are adjacent, and there is a fourth gap between the identification lead and the adjacent first lead or between the identification lead and the adjacent second lead, the fourth gap is greater than the third gap.

16. The substrate in accordance with claim 15, wherein there is a fifth gap between the identification lead and the first dummy line, and the fifth gap is equal to the third gap.

17. The substrate in accordance with claim 12, wherein there is a third gap between the first and second leads which are adjacent, and there is a fourth gap between the identification lead and the adjacent first lead or between the identification lead and the adjacent second lead, the fourth gap is greater than the third gap, there is a fifth gap between the identification lead and the first dummy line, and there is a sixth gap between the identification lead and the second dummy line, the fifth and sixth gaps are equal to the third gap.

\* \* \* \* \*